US007865164B2

(12) United States Patent
Xu et al.

(10) Patent No.: US 7,865,164 B2
(45) Date of Patent: Jan. 4, 2011

(54) APPARATUS AND METHODS FOR DOWNCONVERTING RADIO FREQUENCY SIGNALS

(75) Inventors: Yang Xu, Chicago, IL (US); Solti Peng, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 615 days.

(21) Appl. No.: 11/862,516

(22) Filed: Sep. 27, 2007

(65) Prior Publication Data

US 2009/0088122 A1  Apr. 2, 2009

(51) Int. Cl.
*H04Q 1/16* (2006.01)

(52) U.S. Cl. .................................. 455/323; 455/333

(58) Field of Classification Search ................ 455/313, 455/323, 324, 325, 326, 334, 338, 341
See application file for complete search history.

(56) References Cited

U.S. PATENT DOCUMENTS

| 6,230,001 | B1 * | 5/2001 | Wyse ........................ 455/326 |
| 6,807,407 | B2 | 10/2004 | Ji |
| 6,891,423 | B2 | 5/2005 | Bjork et al. |
| 7,400,691 | B2 | 7/2008 | Kaczynski |
| 7,499,693 | B2 * | 3/2009 | Tseng et al. ............... 455/324 |
| 7,529,529 | B2 | 5/2009 | Taylor |
| 2002/0065061 | A1 * | 5/2002 | Schiltz ....................... 455/326 |
| 2006/0293017 | A1 * | 12/2006 | Kim et al. ................... 455/323 |
| 2008/0139162 | A1 * | 6/2008 | Hafizi ........................ 455/325 |

FOREIGN PATENT DOCUMENTS

GB  2423427  8/2006

OTHER PUBLICATIONS

Rahim Bagheri et al: "An 800-MHz-6-GHz Software-Defined Wireless Receiver in 90-nm CMOS" IEEE Journal or Solid-State Circuits, IEEE Service Center, Piscataway, NJ, US, vol. 41, No. 12, (Dec. 1, 2006), pp. 2860-2876, XP011150713.
International Search Report-PCT/US08/077697, International Search Authority—European Patent Office—Mar. 18, 2009.
Written Opinion—PCT/US08/077697, International Search Authority—European Patent Office—Mar. 18, 2009.

* cited by examiner

*Primary Examiner*—Blane J Jackson
(74) *Attorney, Agent, or Firm*—Jiayu Xu

(57) ABSTRACT

A noise isolation passive mixing apparatus is designed to mitigate noise contribution from intermediate frequency (IF) filters and amplifiers in a radio frequency translation stage. Common-gate configuration devices are inserted between passive mixer output and input of a transimpedance amplifier. In this way, circulation of the input-referred noise of the transimpedance amplifier is decreased, because of the relatively high output impedance of the common-gate devices, and the noise figure of the mixing apparatus can be improved. Since the radio frequency signal still sees low impedance, a radio frequency transconductance (RF gm) stage can be removed from the mixing apparatus, reducing current consumption. A double-balanced mixing apparatus with this general architecture may be implemented in a 0.18 micrometer CMOS technology and used in a low-IF global positioning system operating at 1.575 GHz, in an access terminal of a cellular communication system, and in other systems.

15 Claims, 4 Drawing Sheets

APPARATUS AND METHODS FOR DOWNCONVERTING RADIO FREQUENCY SIGNALS

BACKGROUND

1. Field

The present invention relates generally to radio frequency processing systems and methods, including mixers and methods for downconverting to intermediate frequency. The systems and methods may be employed in telecommunications, including uses in cellular telephone receivers and in global positioning system (GPS) receivers.

2. Background

A modern communication system is expected to provide reliable data transmission for a variety of applications, such as voice and data applications. In a point-to-multipoint communications context, known communication systems are based on frequency division multiple access (FDMA), time division multiple access (TDMA), code division multiple access (CDMA), and perhaps other multiple access communication schemes.

A CDMA system may be designed to support one or more CDMA standards, such as (1) the "TIA/EIA-95 Mobile Station-Base Station Compatibility Standard for Dual-Mode Wideband Spread Spectrum Cellular System" (this standard with its enhanced revisions A and B may be referred to as the "IS-95 standard"), (2) the "TIA/EIA-98-C Recommended Minimum Standard for Dual-Mode Wideband Spread Spectrum Cellular Mobile Station" (the "IS-98 standard"), (3) the standard sponsored by a consortium named "3rd Generation Partnership Project" (3GPP) and embodied in a set of documents known as the "W-CDMA standard," (4) the standard sponsored by a consortium named "3rd Generation Partnership Project 2" (3GPP2) and embodied in a set of documents including "TR-45.5 Physical Layer Standard for cdma2000 Spread Spectrum Systems," the "C.S0005-A Upper Layer (Layer 3) Signaling Standard for cdma2000 Spread Spectrum Systems," and the "TIA/EIA/IS-856 cdma2000 High Rate Packet Data Air Interface Specification" (the "cdma2000 standard" collectively), (5) the 1xEV-DO standard, and (6) certain other standards. The standards expressly listed above are incorporated by reference as if fully set forth herein, including annexes, appendices, and other attachments.

It is desirable and sometimes required for a provider of communication services to know the geographic location of the serviced telephones and other user equipment devices. For example, the geographic location may need to be known in order to identify the location to operators responding to emergency telephone calls (e.g., 911 calls in the U.S. and 112 in certain European locales). The U.S. Federal Communications Commission (FCC), for example, mandates Enhanced 911 (E911) services. Knowledge of the geographic location may also be desired to provide users of cellular communication devices with navigational and other location-specific services and advertising. For this reason, many cellular communication devices are equipped with GPS receivers.

Both GPS receivers and cellular system receivers generally include mixers and related devices for converting the received radio frequency signals to a lower frequency, for subsequent processing at that lower frequency. The lower frequency may be an intermediate frequency of the cellular receiver, or an intermediate frequency of a GPS receiver.

A number of sometime competing criteria affect the design of communication devices, such as the cellular and GPS receivers mentioned above. The criteria include size, weight, power consumption, and noise figure. Therefore, there is a need in the art for radio frequency mixing apparatus with improved noise figures. There is also a need in the art for mixing apparatus with reduced size and reduced weight. There is a further need in the art for mixing apparatus with reduced power consumption.

SUMMARY

Embodiments disclosed herein address the above stated needs by providing apparatus and methods for mixing and downconverting (translating) radio frequency signals to an intermediate frequency.

In an embodiment, a mixing apparatus includes a mixing core with one or more mixing core outputs. The mixing core is configured to (i) receive one or more phases of a radio frequency (RF) signal at RF frequency, (ii) receive one or more phases of a local oscillator (LO) signal, (iii) mix the RF signal with the LO signal to obtain an intermediate frequency (IF) signal at IF frequency, the IF signal being the RF signal downconverted using the LO signal, and (iv) output the one or more phases of the IF signal through the one or more mixing core outputs, one phase of the IF signal per mixing core output. The mixing apparatus also includes a current buffer with one or more current buffer inputs and one or more current buffer outputs, one current buffer input and one current buffer output per phase of the IF signal. Each current buffer input presents no more than a first input impedance, and each current buffer output presents at least a first output impedance. The first output impedance is greater than the first input impedance. The mixing apparatus further includes a transimpedance amplifier (TIA) with one or more TIA inputs and one or more TIA outputs, one TIA input and one TIA output per phase of the IF signal. For each phase of the IF signal, the mixing core output corresponding to said each phase of the IF signal is coupled to the current buffer input corresponding to said each phase of the IF signal, and the current buffer output corresponding to said each phase of the IF signal is coupled to the TIA input corresponding to said each phase of the IF signal. In this way, said each phase of the IF signal output by the mixing core is buffered in the current buffer and processed in the transimpedance amplifier.

In an embodiment, a mixing apparatus includes a mixing core with a first mixing core output. The mixing core is configured to (i) receive a radio frequency (RF) signal at RF frequency, (ii) receive a local oscillator (LO) signal, (iii) mix the RF signal with the LO signal to obtain an intermediate frequency (IF) signal at IF frequency, the IF signal being the RF signal downconverted using the LO signal, and (iv) output a first phase of the IF signal through the first mixing core output. The mixing apparatus also includes a current buffer with a first current buffer input and a first current buffer output associated with the first current buffer input. The first current buffer input presents no more than a first input impedance, and the first current buffer output presents at least a first output impedance, which is greater than the first input impedance. The mixing apparatus further includes a transimpedance amplifier (TIA) with a first TIA input, and a first TIA output associated with the first TIA input. The first mixing core output is coupled to the first current buffer input, and the first current buffer output is coupled to the first TIA input, so that the first phase of the IF signal is buffered in the current buffer and processed in the transimpedance amplifier.

In an embodiment, a method of mixing signals includes receiving by a mixing core one or more phases of a radio frequency (RF) signal at RF frequency, receiving by the mixing core one or more phases of a local oscillator (LO) signal, and mixing in the mixing core the RF signal with the LO signal to obtain an intermediate frequency (IF) signal at IF frequency. The IF signal is the RF signal downconverted using the LO signal. The method also includes outputting the one or more phases of the IF signal from the mixing core through one or more mixing core outputs, one phase of the IF signal per mixing core output. The method further includes receiving at a current buffer the one or more phases of the IF signal. The current buffer includes one or more current buffer inputs and one or more current buffer outputs, one current buffer input and one current buffer output per phase of the IF signal. Each current buffer input presents no more than a first input impedance, and each current buffer output presents at least a first output impedance, with the first output impedance being greater than the first input impedance. The method further includes processing the one or more phases of the IF signal at the one or more current buffer outputs using a transimpedance amplifier (TIA). The transimpedance amplifier includes one or more TIA inputs and one or more TIA outputs, one TIA input and one TIA output per phase of the IF signal.

These and other embodiments and aspects of the present invention will be better understood with reference to the following description, drawings, and appended claims.

DETAILED DESCRIPTION

Figure 1:
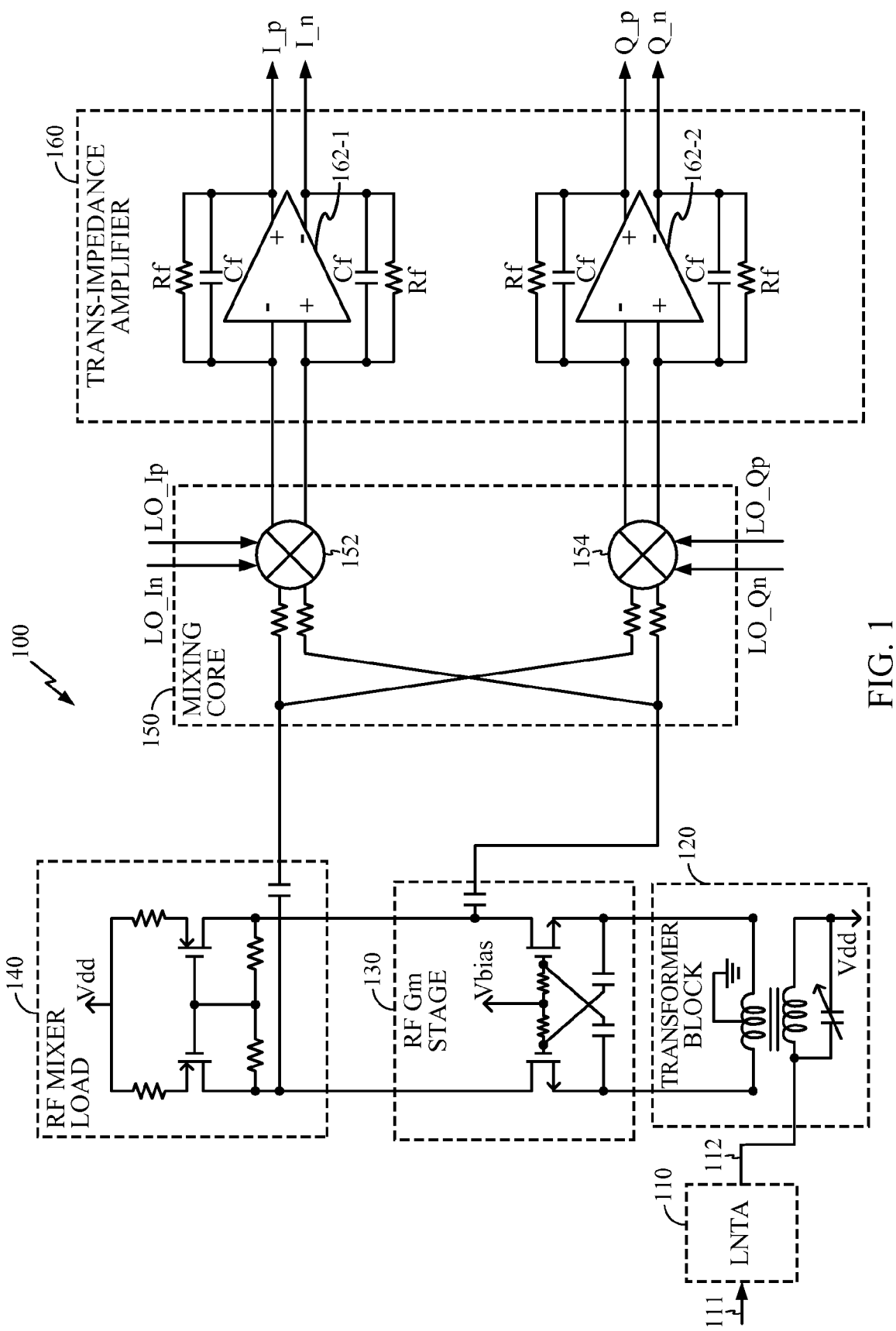
FIG. 1 illustrates selected components and blocks of a passive mixing apparatus.

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context can refer to a particular apparatus, process, or article of manufacture; the same or a similar expression in a different place can refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

A "transimpedance amplifier" or "TIA" is an amplifier designed to provide substantially voltage-source (low impedance) output or outputs.

An access terminal, which also may be referred to as AT, subscriber station, user equipment, UE, mobile terminal, MT, or cellular communication device may be mobile or stationary, and may communicate with one or more base transceiver stations. An access terminal may be any of a number of types of devices, including but not limited to personal computer (PC) card, external or internal modem, wireless telephone, and personal digital assistant (PDA) with wireless communication capability. An access terminal transmits and receives data packets to or from a radio network controller through one or more base transceiver stations.

Base transceiver stations and base station controllers are parts of a network called radio network, RN, access network, and AN. A radio network may be a UTRAN or UMTS Terrestrial Radio Access Network. The radio network may transport data packets between multiple access terminals. The radio network may be further connected to additional networks outside the radio network, such as a corporate intranet, the Internet, a conventional public switched telephone network (PSTN), or another radio network, and may transport data and voice packets between each access terminal and such outside networks. Depending on conventions and on the specific implementations, a base transceiver station may be referred to by other names, including Node-B, base station system (BSS), and simply base station. Similarly, a base station controller may be referred to by other names, including radio network controller, RNC, controller, mobile switching center, or serving GPRS support node.

The scope of the invention extends to these and similar wireless communication system components, as well as to other electronic equipment.

FIG. 1 illustrates selected components and blocks of a passive mixing apparatus 100 that can be used, for example, in a front end of a receiver. The receiver may be a cellular receiver of an access terminal, a base station, a GPS receiver of an access terminal, a GPS receiver of another kind of GPS unit, or a receiver of a different kind of equipment. The passive mixing apparatus 100 includes a low noise amplifier (LNA or LNTA, if it is tunable) 110, a transformer block 120, a radio frequency transconductance (RF Gm) stage 130, a radio frequency (RF) mixer load 140, a mixing core 150, and a transimpedance amplifier (TIA) 160. Selected components of certain embodiments of the transformer block 120, the RF Gm stage 130, the RF mixer load 140, and the transimpedance amplifier 160 are illustrated in FIG. 1, but embodiments using different components and different internal structures are also possible.

In operation, an RF signal comes into an input 111 of the LNTA 110. The LNTA 110 amplifies the RF signal and outputs it through an output 112 and the transformer block 120 to the RF Gm stage 130, as shown. The mixing core 150 receives the RF signal processed in the RF Gm stage 130 and the RF mixer load 140. The mixing core 150 also receives the local oscillator (LO) signal through inputs LO_Ip, LO_In, LO_Qp, and LO_Qn.

As a person skilled in the art of RF design would understand after perusing this document, the capital letter "I" in the second part of the monikers LO_Ip and LO_In refers to the "I" phase of the local oscillator signal, while the capital letter "Q" in the second part of the monikers LO_Qp and LO_Qn refers to the "Q" phase of the same local oscillator signal; the lower case letters "p" and "n" similarly refer to the positive and negative polarities of the inputs LO_Ip, LO_In, LO_Qp, and LO_Qn. In sum, the mixing core 150 receives four different phases of the local oscillator signal. It should be noted that similar notation may be used to denote different phases of other signals, such as the intermediate frequency signal discussed below.

The RF Gm stage 130 provides a relatively low driving impedance at the inputs of the current mode mixers of the mixing core 150, and also provides isolation of the front end of the receiver from leakage of the LO frequency. The RF mixer load 140 matches the impedance at the second input to the mixing core 150, providing for balanced mixer operation.

The mixing core 150 mixes the different phases of the RF signal received from the RF Gm stage 130 and the RF mixer load 140 with the different phases of the local oscillator signal in the Complimentary Metal Oxide Semiconductor (CMOS) mixers 152 and 154, generating four phases of an intermediate frequency (IF) signal. The local oscillator frequency may be selected so that the IF frequency is in a relatively low frequency range. The IF range may be below 100 MHz, for example, between 2 MHz and 10 MHz.

The four phases of the IF signal output by the mixing core 150 are coupled to the transimpedance amplifier 160. In the transimpedance amplifier 160, each of the IF phase pairs I and Q is amplified by one of the fully-differential operational amplifiers 162-1 or 162-2, as shown. Each of the operational amplifiers 162 is connected in a feedback configuration so that the transfer function of the circuit with the operational amplifiers 162 is essentially a ratio of the impedance in the feedback connection of the particular operational amplifier to the output impedance of the mixing core 150 seen from the input of the transimpedance amplifier 160. All the feedback resistors $R_f$ used with the amplifiers 162 may be identical or substantially identical, for example, within 1, 2, 3, 5, or 10 percent tolerance; similarly, all the feedback capacitors $C_f$ used with the amplifiers 162 may also be identical or substantially identical, for example, within 1, 2, 3, 5, or 10 percent tolerance. The function of the transimpedance amplifier 160 is to provide low output impedances at the signal outputs. Thus, each of the outputs I_p, I_n, Q_p, and Q_n of the transimpedance amplifier 160 is essentially a voltage source due to the low output impedance of the operational amplifiers 160.

Figure 2:
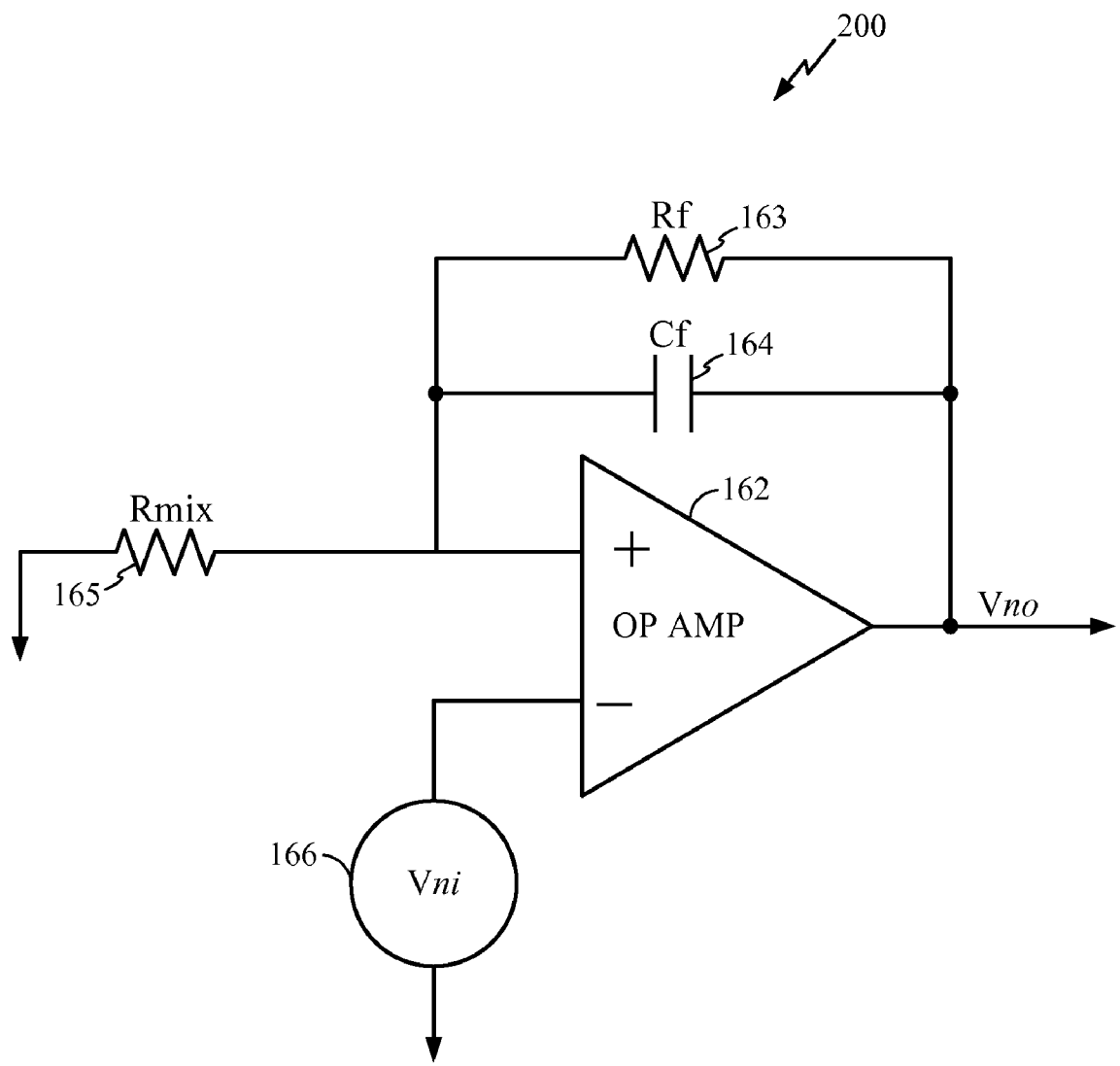
FIG. 2 illustrates a model of a path of an intermediate frequency signal through an operational amplifier of a transimpedance amplifier of a passive mixing apparatus.

FIG. 2 illustrates a model 200 of a path of the IF signal through one of the operational amplifiers 162 of the transimpedance amplifier 160. In this Figure, Rmix 165 designates the output impedance of the mixing core 150; Vni 166 is the input-referenced noise source of the operational amplifier 162 (i.e., the equivalent input noise source intended to model the noise contribution of the operational amplifier 162); Vno is the output noise due to Vni 166, and Rf 163 and Cf 164 are the feedback resistor and capacitor, respectively. As a person skilled in the art would understand after perusing this document, the output noise Vno can be described by the following equation:

$$Vno = Vni \cdot \left[1 + \frac{Rf \| Cf}{Rmix}\right] \quad (1)$$

In this equation (1), the symbols Rf∥Cf signify the impedance of the parallel combination of the Rf 163 resistor and the Cf 164 capacitor.

The output noise Vno may be relatively high due to the switched capacitor effect of the passive mixing apparatus.

One way to reduce the noise contribution of the operational amplifiers 162 is to design these operational amplifiers as low noise devices. This solution, however, typically increases both current consumption and silicon area needed for the operational amplifiers. The total current consumption of the passive mixing apparatus 100 may also be increased because of the relatively high current consumption in the RF Gm stage 130, in order to provide low impedance as seen by the inputs of the mixing core 150 and also to provide LO isolation from the front end of the receiver.

Figure 3:
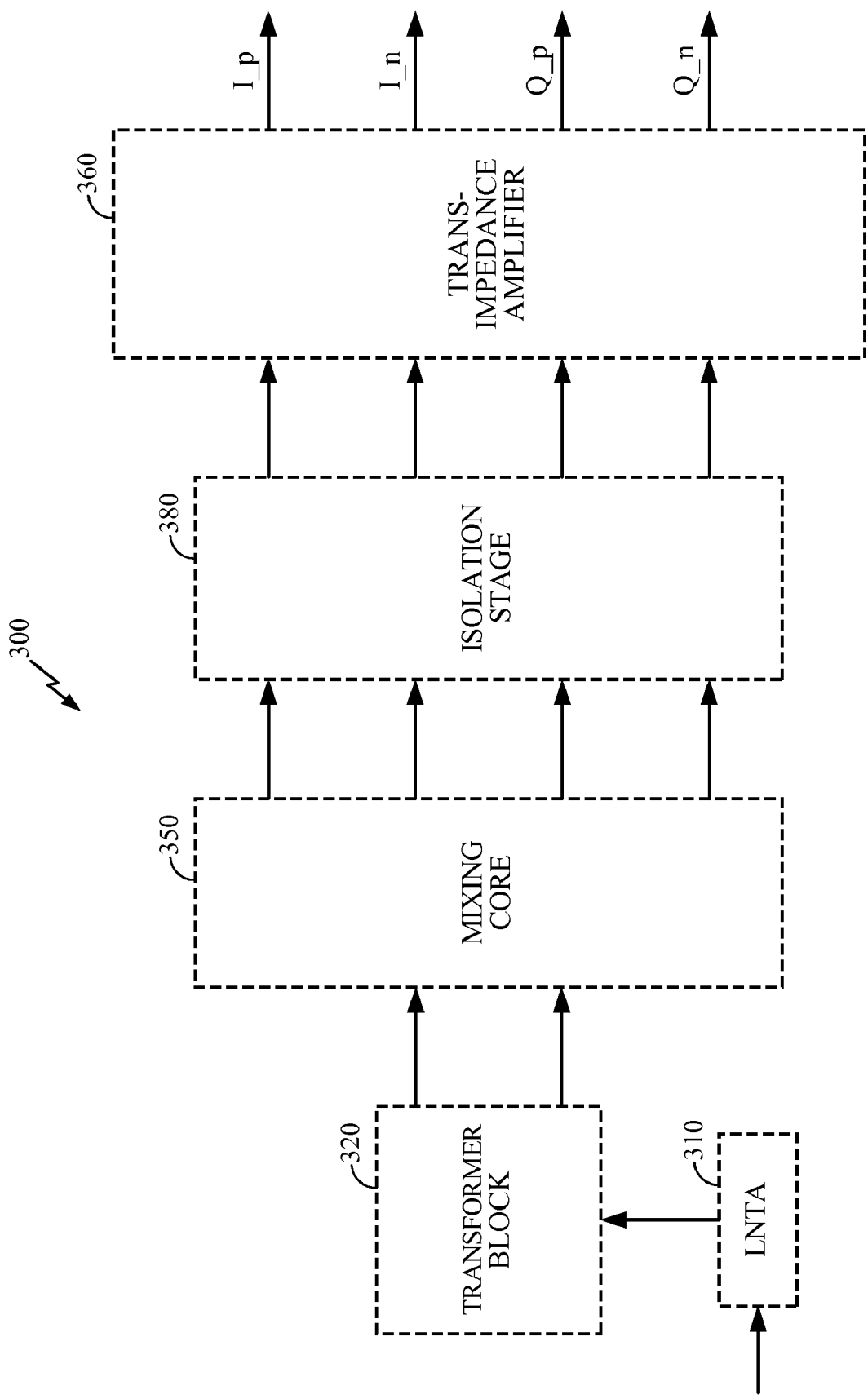
FIG. 3 illustrates selected blocks of an embodiment of a passive mixing apparatus.

FIG. 3 illustrates selected components and blocks of a passive mixing apparatus 300. In this embodiment, an RF signal is coupled to a mixing core 350 through an LNTA 310 and a transformer block 320. The outputs of the mixing core 350 are coupled to a transimpedance amplifier 360 not directly, as was the case with the mixing apparatus 100 of FIG. 1, but through an isolation stage 380. The isolation stage may be a current buffer, which is designed for relatively high output impedances, while being configured for receiving the IF signals from relatively low impedances of the mixing core 350. In the context of the description of the isolation stage 380, "relatively high impedance" refers to impedance that is considerably higher than the Rmix output impedance of a CMOS mixing core, such as the core 150 or 350.

In variants, the output impedance of the isolation stage 380 exceeds the output impedance of the CMOS mixing core 350 by a factor of ten; in more specific variants, the output impedance of the isolation stage 380 exceeds the output impedance of the mixing core 350 by a factor of fifty. The input impedance of the isolation stage 380 may be the same or substantially the same as the output impedance of the mixing core 350, so that the above ratios may also describe the relationship of the output to input impedance of the isolation stage 380. In variants, the output impedance of the isolation stage 380 is at least fifty Kilo-ohms; in more specific variants, the output impedance of the isolation stage 380 is at least one hundred Kilo-ohms; in still more specific variants, the output impedance of the isolation stage 380 is at least two hundred Kilo-ohms. Note that the impedance values (and ratios) here refer to impedance magnitudes (and ratios of impedance magnitudes) at the specific intermediate frequency of operation. Indeed, the impedances are typically capacitive at that frequency, due to the presence of parasitic capacitors.

Because the isolation stage 380 has a relatively high output impedance, the noise contribution of the transimpedance amplifier 360 is decreased, as follows from the formula (1) stated above.

The LNTA 310 may be identical, similar, or analogous (similar with necessary or desirable changes for accommodating other circuit changes) to the LNTA 110. The transformer block 320 may be identical, similar, or analogous to the transformer block 120. The mixing core 350 may be identical, similar, or analogous to the mixing core 150. In specific embodiments, the mixing core 350 is a double-balanced mixer implemented in a 0.18 µm CMOS technology and used in a low-IF GPS architecture operating at 1.575 GHz. The transimpedance amplifier 360 may be identical, similar, or analogous to the transimpedance amplifier 160. These need not be requirements of the invention.

Figure 4:
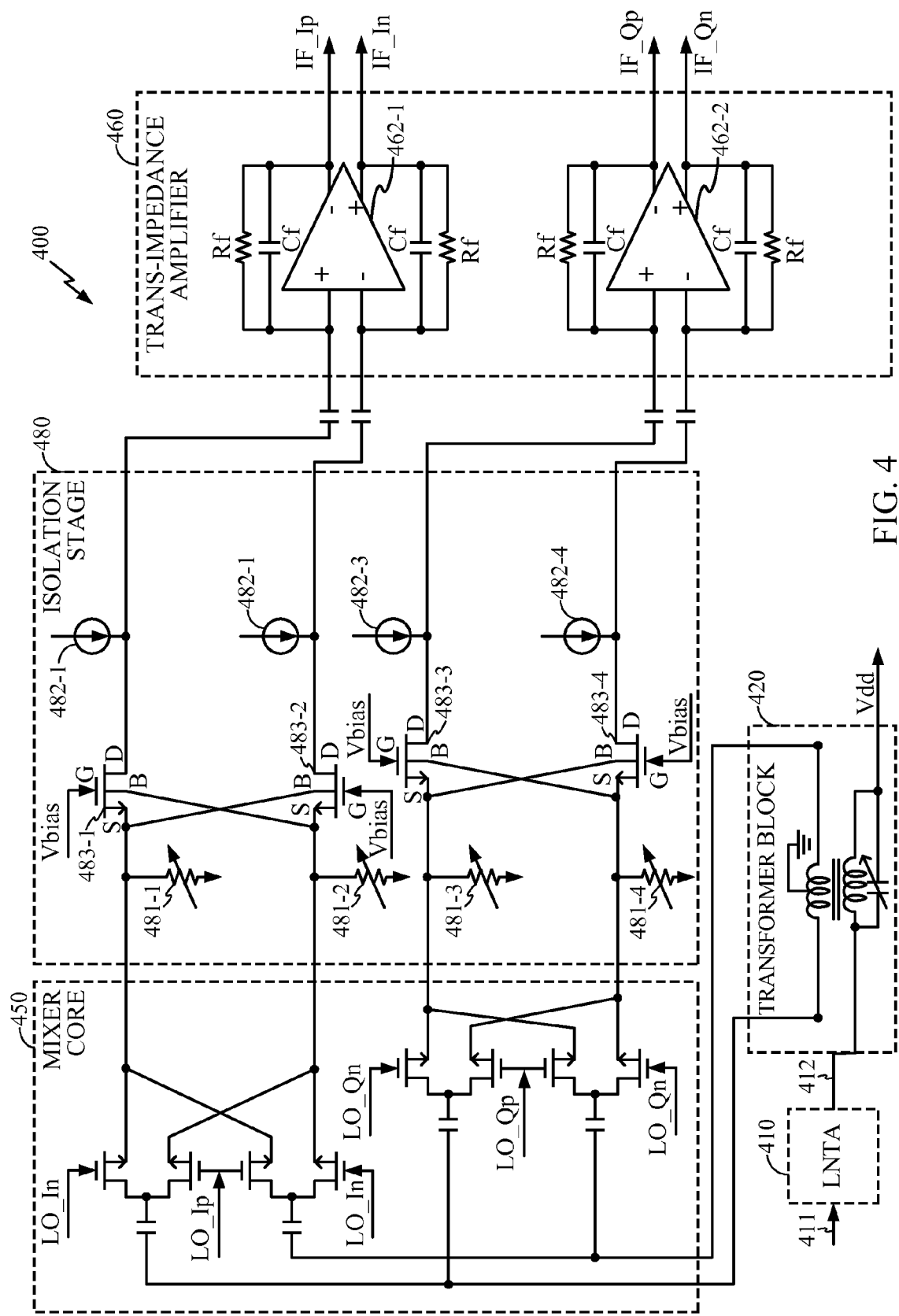
FIG. 4 illustrates selected blocks and components of an embodiment of a passive mixing apparatus.

FIG. 4 illustrates selected details of another embodiment of a passive mixing apparatus 400, which is similar to (or is a detailed version of) the passive mixing apparatus 300. Here, the LNTA 410 may be identical, similar, or analogous to the LNTA 110; the transformer block 420 may be identical, similar, or analogous to the transformer block 120; and the transimpedance amplifier 460 may be identical, similar, or analogous to the transimpedance amplifier 160.

The mixing core 450 includes eight CMOS devices configured as shown. (The same CMOS configuration may be used in the mixing apparatus 100.) The isolation stage 480 includes four CMOS common-gate devices 483-1 through 483-4, four source biasing resistors 481-1 through 481-4, and four biasing current sources 482-1 through 482-4, configured as shown. Each of the CMOS common-gate devices 483 includes a source node S, a drain node D, a gate node G, and a bulk node B.

Note cross-coupling of the CMOS bulk nodes B to source nodes S in the isolation stage 480. As shown in FIG. 4, the source node of the device 483-1 is coupled to the bulk node of the device 483-2; the source node of the device 483-2 is coupled to the bulk node of the device 483-1; the source node of the device 483-3 is coupled to the bulk node of the device 483-4; and the source node of the device 483-4 is coupled to the bulk node of the device 483-3. Such cross-coupling, although not necessarily a requirement, boosts the Gm parameter of the isolation stage, and consequently reduces the input impedance (1/Gm) of the isolation stage 480.

In some variants, the CMOS devices 483 are NFET devices, because of their higher carrier mobility. In other embodiments, the CMOS devices 483 are PFET devices. In still other embodiments, the isolation stage 480 includes both NFET and PFET devices.

In the embodiment 400 of FIG. 4, the Ip, In, Qp, and Qn phases of the Intermediate Frequency output by the mixing core 450 are coupled to source nodes of the devices 483-1, 483-2, 483-3, and 483-4, respectively. The In and Ip phases of the IF output by the isolation stage 480 are coupled to inverting and non-inverting inputs of the first operational amplifier 462-1 of the TIA 460, respectively. Similarly, the Qn and Qp phases of the IF output by the isolation stage 480 are coupled to inverting and non-inverting inputs of the second operational amplifier 462-2 of the TIA 460, respectively. The biasing resistors 481, the biasing current sources 482, and the voltage Vbias applied to the gates of the four devices 483 all keep the devices 483 in the appropriate operating region for providing isolation and/or impedance matching functionality described above.

As shown in FIGS. 3 and 4, an RF Gm stage need not be interposed between the transformer block 320 (or 420) and the mixing core 350 (or 450), although presence of an RF Gm stage here is not necessarily precluded in some variants. Because there is no RF Gm stage, there may also be no need for an RF mixer load, although presence of such load is also not necessarily precluded in some variants. The RF Gm stage and/or an RF mixer load are not included in the embodiments illustrated in FIGS. 3 and 4 because the isolation stage 380 (or 480) provides additional isolation for the front end, and because impedance matching of the mixing core 350 (450) is now less critical and easier to obtain. The outputs of the mixing core 350 (450) still see relatively low input impedance (1/Gm), while the TIA transimpedance amplifier 360 (460) sees very large output impedance (1/Gds) of the isolation stage 380 (480), thereby significantly mitigating the noise contribution of the operational amplifiers 362 (462). In particular, the common-gate devices used in the isolation stage 380 (480) provide low input impedances for the isolation stage. This asymmetric impedance response isolates the noise from the operational amplifiers 362 (462), and prevents the noise from circulating to output of the transimpedance amplifier 360 (460).

Note that designing and implementing the isolation stage 380 (480) is typically easier than designing and implementing the RF Gm stage and the RF mixer load, because the isolation stage operates at the intermediate frequency, which can be much lower than the RF frequency at the output of the low noise amplifier 310 (410). At such lower IF, current consumption can be decreased to achieve the same Gm, possibly at the cost of increased device size. Also, it is much easier to tune the mixer current based on the different linearity requirement.

In a limited sense, the scheme of FIGS. 3 and 4 moves the Gm RF stage from the RF side to the IF side of the mixing core 350 (450), achieving similar low input impedance, as well as significant power consumption savings. (But the isolation stage may be a current buffer, not merely a Gm stage.) Potentially, the noise performance constraints on the amplifiers 362 (462) can also be relaxed.

It should be understood that different isolation or buffer stage configurations may be used between a mixing core and a transimpedance amplifier, in accordance with different implementations. It should be further understood that fewer or more components than shown may be used, either in the shown embodiment or in yet other embodiments.

Although steps and decisions of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the order described above. Furthermore, not every illustrated step and decision may be required in every embodiment/variant in accordance with the invention, while some steps and decisions that have not been specifically illustrated may be desirable or necessary in some embodiments/variants in accordance with the invention.

Those skilled in the art would understand that different CMOS devices may be used in the mixing core, the isolation (buffer) stage, and elsewhere, including both N-channel and P-channel devices, with appropriate circuit changes due to the changed polarity of the transistor devices.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A mixing apparatus comprising:
  a mixing core comprising one or more mixing core outputs, the mixing core being configured to
    receive one or more phases of a radio frequency (RF) signal at RF frequency,
    receive one or more phases of a local oscillator (LO) signal,
    mix the RF signal with the LO signal to obtain an intermediate frequency (IF) signal at IF frequency, the IF signal being the RF signal downconverted using the LO signal, and
    output the one or more phases of the IF signal through the one or more mixing core outputs, one phase of the IF signal per mixing core output;
  a current buffer comprising one or more current buffer inputs and one or more current buffer outputs, one current buffer input per phase of the IF signal, one current buffer output per phase of the IF signal, each current buffer input presenting no more than a first input impedance, each current buffer output presenting at least a first output impedance, the first output impedance being greater than the first input impedance; and
  a transimpedance amplifier (TIA) comprising one or more TIA inputs and one or more TIA outputs, one TIA input per phase of the IF signal, one TIA output per phase of the IF signal,
  wherein:
    for each phase of the IF signal, the mixing core output corresponding to said each phase of the IF signal is coupled to the current buffer input corresponding to said each phase of the IF signal, the current buffer output corresponding to said each phase of the IF signal is coupled to the TIA input corresponding to said each phase of the IF signal, so that said each phase of the IF signal output by the mixing core is buffered in the current buffer and processed in the transimpedance amplifier;
    the one or more phases of the IF signal comprise at least a first IF phase and a second IF phase, the current buffer comprises a first Complimentary Metal Oxide Semiconductor (CMOS) common-gate device between the current buffer input corresponding to the first IF phase and the current buffer output corresponding to the first IF phase, the current buffer further comprises a second CMOS common-gate device between the current buffer input corresponding to the second IF phase and the current buffer output corresponding to the second IF phase;
    the first CMOS common-gate device comprises a first bulk node, a first source node, a first gate node, and a first drain node;
    the second CMOS common-gate device comprises a second bulk node, a second source node, a second gate node, and a second drain node;
    the first bulk node is connected to the second source node; and
    the second bulk node is coupled to the first source node.

2. The mixing apparatus of claim 1, wherein the first output impedance is at least fifty Kilo-ohms.

3. The mixing apparatus of claim 1, wherein the first output impedance is at least one hundred Kilo-ohms.

4. The mixing apparatus of claim 1, wherein the first output impedance is at least two hundred Kilo-ohms.

5. The mixing apparatus of claim 1, wherein the first output impedance is at least ten times the first input impedance.

6. The mixing apparatus of claim 1, wherein the first output impedance is at least fifty times the first input impedance.

7. The mixing apparatus of claim 1, further comprising an RF amplifier and a transformer block, the RF amplifier being configured to output the RF signal to the mixing core through the transformer block without an RF transconductance stage (RF Gm) being interposed between the RF amplifier and the mixing core.

8. The mixing apparatus of claim 1, wherein:
  the one or more phases of the IF signal comprise an IF_Ip phase, an IF_In phase, an IF_Qp phase, and an IF_Qn phase;
  the first Complimentary Metal Oxide Semiconductor (CMOS) common gate device is configured between the current buffer input corresponding to the IF_Ip phase and the current buffer output corresponding to the IF_Ip phase;
  the second CMOS common-gate device is configured between the current buffer input corresponding to the IF_In phase and the current buffer output corresponding to the IF_In phase; and
  the current buffer further comprises:
    a third CMOS common-gate device between the current buffer input corresponding to the IF_Qp phase and the current buffer output corresponding to the IF_Qp phase, and
    a fourth CMOS common-gate device between the current buffer input corresponding to the IF_Qn phase and the current buffer output corresponding to the IF_Qn phase, and
  wherein:
  each of the first, second, third, and fourth CMOS common-gate devices comprises a bulk node, a source node, a gate node, and a drain node;
  the bulk node of the third CMOS common-gate device is coupled to the source node of the fourth CMOS common-gate device; and the bulk node of the fourth CMOS common-gate device is coupled to the source node of the third CMOS common-gate device.

9. The mixing apparatus of claim 1, wherein the transimpedance amplifier comprises one or more fully-differential operational amplifiers.

10. The mixing apparatus of claim 1, further comprising a local oscillator configured to generate the LO signal so that the IF frequency falls between two and ten Megahertz (MHz).

11. The mixing apparatus of claim 1, wherein the mixing core comprises a plurality of Complimentary Metal Oxide Semiconductor (CMOS) devices.

12. The mixing apparatus of claim 1, wherein the mixing core is configured to mix the RF signal with the LO signal to obtain an intermediate frequency (IF) signal using a plurality of Metal Oxide Semiconductor (CMOS) devices.

13. The mixing apparatus of claim 1, wherein the current buffer comprises cross-coupled means for providing current buffering.

14. A mixing apparatus comprising:
   a mixing core comprising a first mixing core output, the mixing core being configured to
      receive a radio frequency (RF) signal at RF frequency,
      receive a local oscillator (LO) signal,
      mix the RF signal with the LO signal to obtain an intermediate frequency (IF) signal at IF frequency, the IF signal being the RF signal downconverted using the LO signal, and
      output a first phase of the IF signal through the first mixing core output;
   a current buffer comprising a first current buffer input and a first current buffer output associated with the first current buffer input, the first current buffer input presenting no more than a first input impedance, the first current buffer output presenting at least a first output impedance, the first output impedance being greater than the first input impedance; and
   a transimpedance amplifier (TIA) comprising a first TIA input and a first TIA output associated with the first TIA input,
   wherein:
      the first mixing core output is coupled to the first current buffer input, and the first current buffer output is coupled to the first TIA input, so that the first phase of the IF signal is buffered in the current buffer and processed in the transimpedance amplifier;
      the mixing core further comprises a second mixing core output, the mixing core being further configured to output a second phase of the IF signal through the second mixing core output;
      the current buffer further comprises a second current buffer input and a second current buffer output associated with the second current buffer input, the second current buffer input presenting no more than the first input impedance, the second current buffer output presenting at least the first output impedance;
      the transimpedance amplifier (TIA) further comprises a second TIA input and a second TIA output associated with the second TIA input;
      the second mixing core output is coupled to the second current buffer input, and the second current buffer output is coupled to the second TIA input, so that the second phase of the IF signal is buffered in the current buffer and processed in the transimpedance amplifier; and
      the current buffer comprises a first Complimentary Metal Oxide Semiconductor (CMOS) common-gate device between the first current buffer input and the first current buffer output, and a second Complimentary Metal Oxide Semiconductor (CMOS) common-gate device between the second current buffer input and the second current buffer output, the first CMOS common-gate device comprising a first source node, a first drain node, a first gate node, and a first bulk node, the second CMOS common-gate device comprising a second source node, a second drain node, a second gate node, and a second bulk node, the first bulk node being coupled to the second source node, the second bulk node being coupled to the first source node.

15. The mixing apparatus of claim 14, further comprising an RF amplifier and a transformer block, the RF amplifier being configured to provide the RF signal to the mixing core through the transformer block without an RF transconductance (RF Gm) stage being interposed between the RF amplifier and the mixing core.

* * * * *